(12) United States Patent
Belmont et al.

(10) Patent No.: US 6,289,583 B1
(45) Date of Patent: Sep. 18, 2001

(54) METHOD FOR MAKING CARDS WITH MULTIPLE CONTACT TIPS FOR TESTING SEMICONDUCTOR CHIPS

(75) Inventors: Andre Belmont, La Batie Divisin; Vincent Reynaud, Grenoble; William Daniau, Besancon, all of (FR)

(73) Assignee: Mesatronic, Saint Jean De Moirans (FR)

( * ) Notice: Subject to any disclaimer, the term of this patent is extended or adjusted under 35 U.S.C. 154(b) by 0 days.

(21) Appl. No.: 09/381,437

(22) PCT Filed: Apr. 9, 1998

(86) PCT No.: PCT/FR98/00718

§ 371 Date: Sep. 21, 1999

§ 102(e) Date: Sep. 21, 1999

(87) PCT Pub. No.: WO98/45716

PCT Pub. Date: Oct. 15, 1998

(30) Foreign Application Priority Data

Apr. 10, 1997 (FR) .................................................. 97/04635

(51) Int. Cl.⁷ ................................ H01R 9/00; B44C 1/22
(52) U.S. Cl. ........................... 29/842; 29/825; 156/630.1; 156/654.1; 156/657.1; 324/754; 324/765
(58) Field of Search .................. 29/846, 842; 156/630.1, 156/654.1, 657.1; 324/765, 754

(56) References Cited

U.S. PATENT DOCUMENTS

| 4,924,589 | * | 5/1990 | Leedy . |
| 4,952,272 | * | 8/1990 | Okino et al. . |
| 5,103,557 | * | 4/1992 | Leedy . |
| 5,177,438 | | 1/1993 | Littlebury et al. . |
| 5,177,439 | * | 1/1993 | Liu et al. . |
| 5,323,035 | * | 6/1994 | Leedy . |
| 5,419,807 | * | 5/1995 | Akram et al. . |
| 5,475,318 | | 12/1995 | Marcus et al. . |
| 5,483,741 | * | 1/1996 | Akram et al. . |

FOREIGN PATENT DOCUMENTS

| 0 475 050 A3 | 7/1991 | (EP) . |
| 0 646 800 A1 | 9/1994 | (EP) . |
| WO 89/11659 | 11/1989 | (WO) . |
| WO 94/09374 | 4/1994 | (WO) . |
| WO 96/36884 | 11/1996 | (WO) . |

OTHER PUBLICATIONS

Leung, Justin et al., "Active Substrate Membrane Probe Card," XP 000624791, 1995, pp. 29.2.1–29.2.4.

* cited by examiner

Primary Examiner—Carl J. Arbes
(74) Attorney, Agent, or Firm—Oliff & Berridge, PLC

(57) ABSTRACT

The invention relates to a process for manufacturing a card with multiple tips, designed in particular for testing semiconductor chips or integrated circuits before encapsulation thereof and comprising an oxidised silicon substrate 10 on the two opposite surfaces, one of the surfaces being provided with conducting strips connected to contacts in the form of tips 26. A thin metal layer 22 is deposited by vapour deposition in a vacuum or by cathode sputtering on one of the insulated surfaces of the monolithic substrate 10, and the conducting strips are obtained by means of a UV photolithography operation making use of a photosensitive resin, followed by etching of the thin metal layer 22 according to the location and shape of the tips 26. Another UV photolithography operation is then performed consisting in depositing a thick layer 24 of photosensitive resin on the thin etched layer, the resin then being revealed with the drawing 25 of the tips. The tips 26 are finally obtained by electroforming by means of a bath containing metal ions enabling electroformed pads corresponding to the shape of the drawings 25 to be achieved.

16 Claims, 4 Drawing Sheets

VUE DE DESSUS

METHOD FOR MAKING CARDS WITH MULTIPLE CONTACT TIPS FOR TESTING SEMICONDUCTOR CHIPS

BACKGROUND OF THE INVENTION

1. Field of the Invention

The invention relates to a process for manufacturing a card with multiple tips, designed in particular for testing semiconductor chips or integrated circuits before encapsulation thereof and comprising a substrate one of the surfaces of which is provided with conducting strips connected to contacts in the form of tips.

2. Description of Related Art

Cards with tips are used for checking chips or integrated circuits after manufacturing and prior to encapsulation. Cards known up to now generally use different types of technologies, i.e. soldered blade tip cards, epoxy ring cards, and membrane cards, as described in the documents EP-A-0475050, WO 9409374 and EP-0646800. Placing of the tips on these known cards is nevertheless limited to a given number of tips, which is no longer in keeping with the constant progress as far as integration of semiconductor chips is concerned.

The document WO 96/36884 describes a manufacturing process of a card subjected to prior cutting to obtain a system of flexible scales. The connection strips are not mono-layer and do not make use of anisotropic etching of a monolithic substrate.

SUMMARY OF THE INVENTION

A first object of the invention is to define a process for manufacturing cards with multiple tips enabling the precision and density of implantation of the contacts to be increased.

The manufacturing process is characterized by the following stages:

- a thin metal layer is deposited by vapour deposition in a vacuum or by cathode sputtering on one of the insulated surfaces of the monolithic substrate, anisotropic etching of the silicon substrate being performed before the conducting strips are obtained, said etching being non-emergent to constitute an electrical contact connection point,
- the conducting strips are obtained by direct etching,
- a UV photolithography operation is then performed consisting in depositing a thick layer of photosensitive resin on the thin etched layer, the resin then being revealed with the drawing of the tips,
- the tips are manufactured by electroforming by means of a metal ion bath enabling electroformed pads corresponding to the shape of the drawings to be obtained,
- and the remaining layer of resin is finally dissolved in a solvent bath to obtain the final implantation of the tips on the monolithic substrate.

Anisotropic etching is advantageously achieved by immersion of the silicon substrate in potassium hydroxide KOH.

According to one feature of the process, anisotropic etching of the substrate takes place after a first UV photolithography consisting in producing through a mask a local insulation of a layer of photosensitive resin previously deposited on one of the surfaces of the substrate.

The thin metal layer can be formed for example by a nickel-, gold- or aluminium-based material. Any other metallic conducting material can naturally be used.

A second object of the invention also consists in achieving a multiple-tip card, in which the pitch between the different tips is reduced to the minimum, so as to achieve a high contact density.

The tips obtained by a thick UV photolithography and electroforming are formed by metal pads with a diameter of 10 to 100 microns and a thickness of ten to a few tens of microns. The cross sections of the pads can also be square or polygonal cross sections.

Each tip is deposited on the thin conducting layer with or without securing in the substrate. The substrate can be equipped with a damping material arranged under the thin conducting layer opposite the corresponding tip.

BRIEF DESCRIPTION OF THE DRAWINGS

Other advantages and features will become more clearly apparent from the following description of the manufacturing process, and of the different embodiments of the tips illustrated in the accompanying drawings, in which.

DETAILED DESCRIPTION OF A PREFERRED EMBODIMENT

Figure 12:
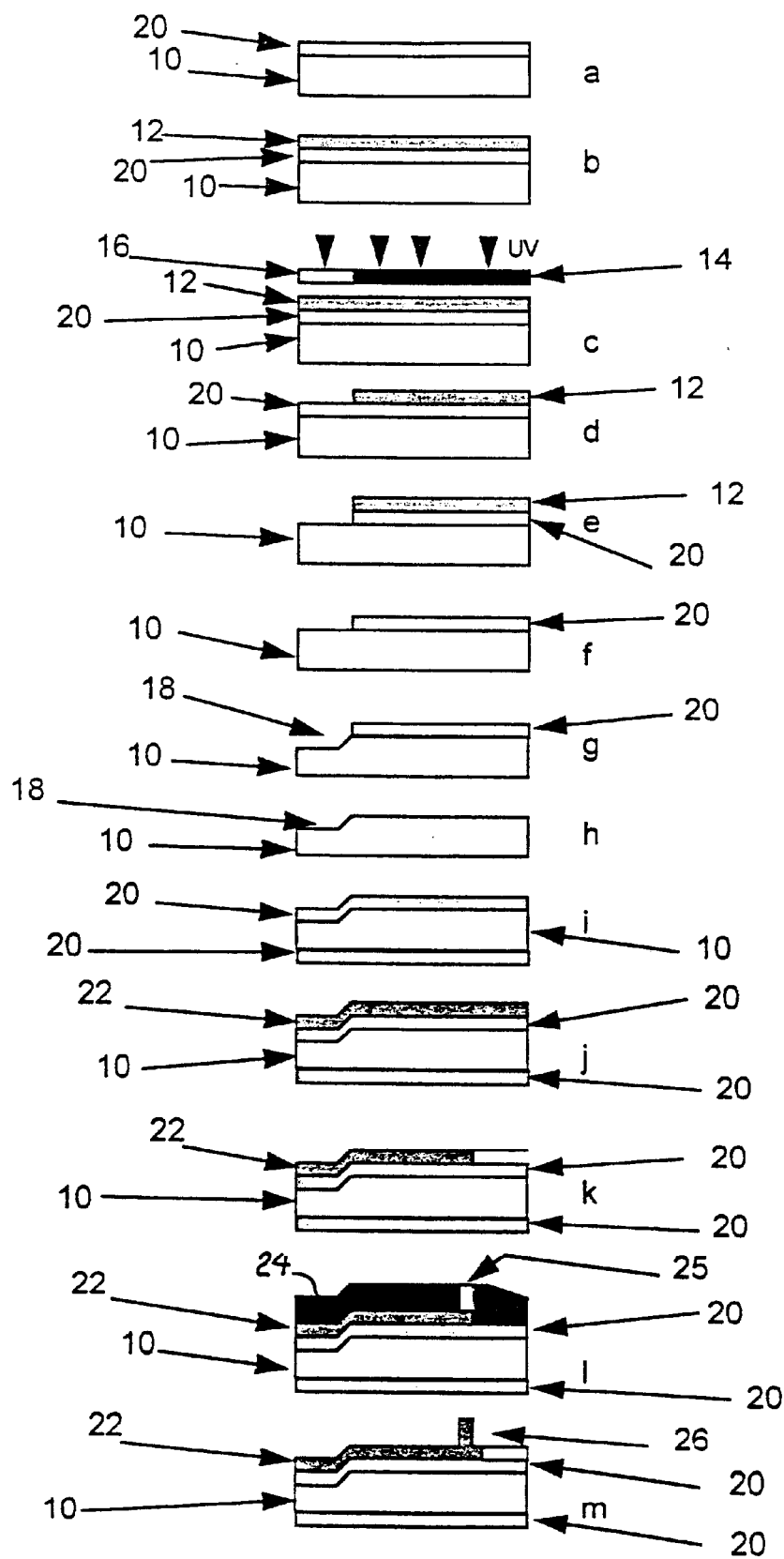
FIG. 12 shows an example of the different chronological stages a–m implemented in the manufacturing process according to the invention.

The different stages of the example of the process for implementation of the multiple tip card for checking chips after manufacturing are illustrated in the drawing of FIG. 12 for indicative purposes.

Stage a:

Starting from a monolithic substrate 10 made of oxidised silicon an insulating layer 20 is formed. The substrate is compatible with the UV photolithography technique enabling required precisions to be obtained, in particular under a micron. Other materials can naturally be used to form the substrate 10, in particular Gallium Arsenide As Ga, quartz, or glass.

Stage b:

The substrate 10 is coated with a photosensitive resin 12 so as to obtain a uniform layer.

Stage c:

A first UV photolithography operation is then performed consisting in producing a local insulation of the resin 12 of the upper layer through a mask 14 having a hole 16 of predetermined shape. The UV radiation is generated by means of an ultraviolet lamp placed above the mask 14.

Stage d:

The insulated resin 12 is dissolved by means of a solvent.

Stage e:

The silicon oxide of the layer 20 is dissolved at the locations cleared by the resin 12.

Stage f:

The resin 12 is dissolved by means of a solvent.

Stage g:

Anisotropic wet etching of the silicon 10 is then performed after the substrate has been immersed in potassium hydroxide KOH. This results in a nonemergent etching 18 of the substrate able to reach a depth of about 200 microns and subsequently constituting a connection point for an electrical contact.

Stage h:

The silicon oxide 20 remaining on the substrate 10 is eliminated in a solvent bath. The substrate 10 with its etching 18 remains.

Stage i:

Thermal oxidation of the silicon substrate 10 is performed so as to obtain two insulating layers 20 of silicon oxide SiO2 on the two surfaces of the substrate.

Stage j:

A thin metal layer 22, for example of nickel, gold or aluminium, is then deposited on the whole surface of the upper insulating layer 20. Deposition of this metal layer 22 is performed by vapour deposition in a vacuum or by cathode sputtering.

Stage k:

This stage comprises a second UV photolithography operation according to the principle set out in stages b and c, and etching of the metal layer 22 according to the location and shape of the tips to be achieved.

Stage l:

A third UV photolithography operation is then performed after a thick layer 24 of photosensitive resin has been deposited on the etched metal layer 22, the resin being revealed with the drawing of the tips. The photolithography operation is followed by an electroforming operation consisting in manufacturing the tips 26 in the form of metal pads with a diameter of 30 microns and a thickness of 60 to 100 microns. The material of the electroformed pads is here identical to that of the etched metal layer 22.

Stage m:

The resin layer 24 is finally dissolved in a solvent bath and the final shape of the implantation of the tip 26 on the monolithic substrate 10 is obtained.

Figure 2:
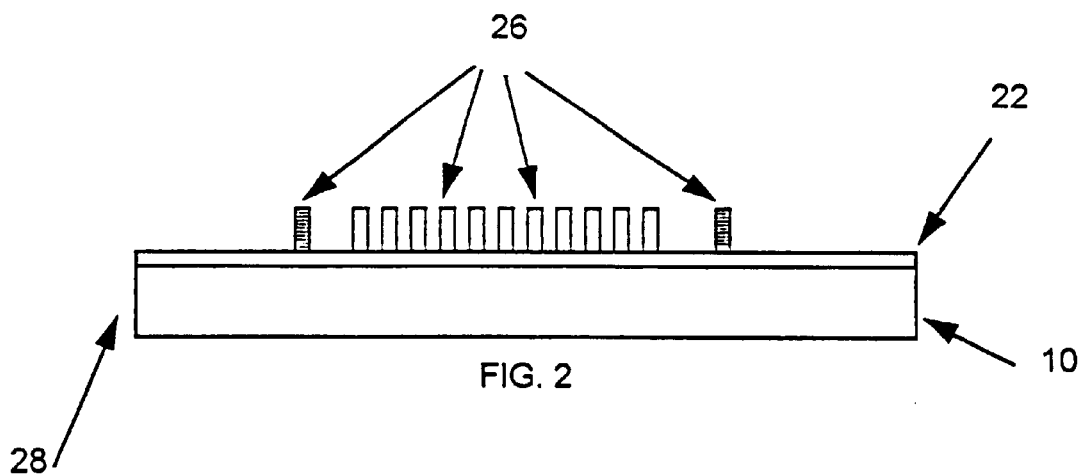
FIG. 2 represents a general vertical sectional view of the substrate equipped with the electroformed tips.
Figure 3:
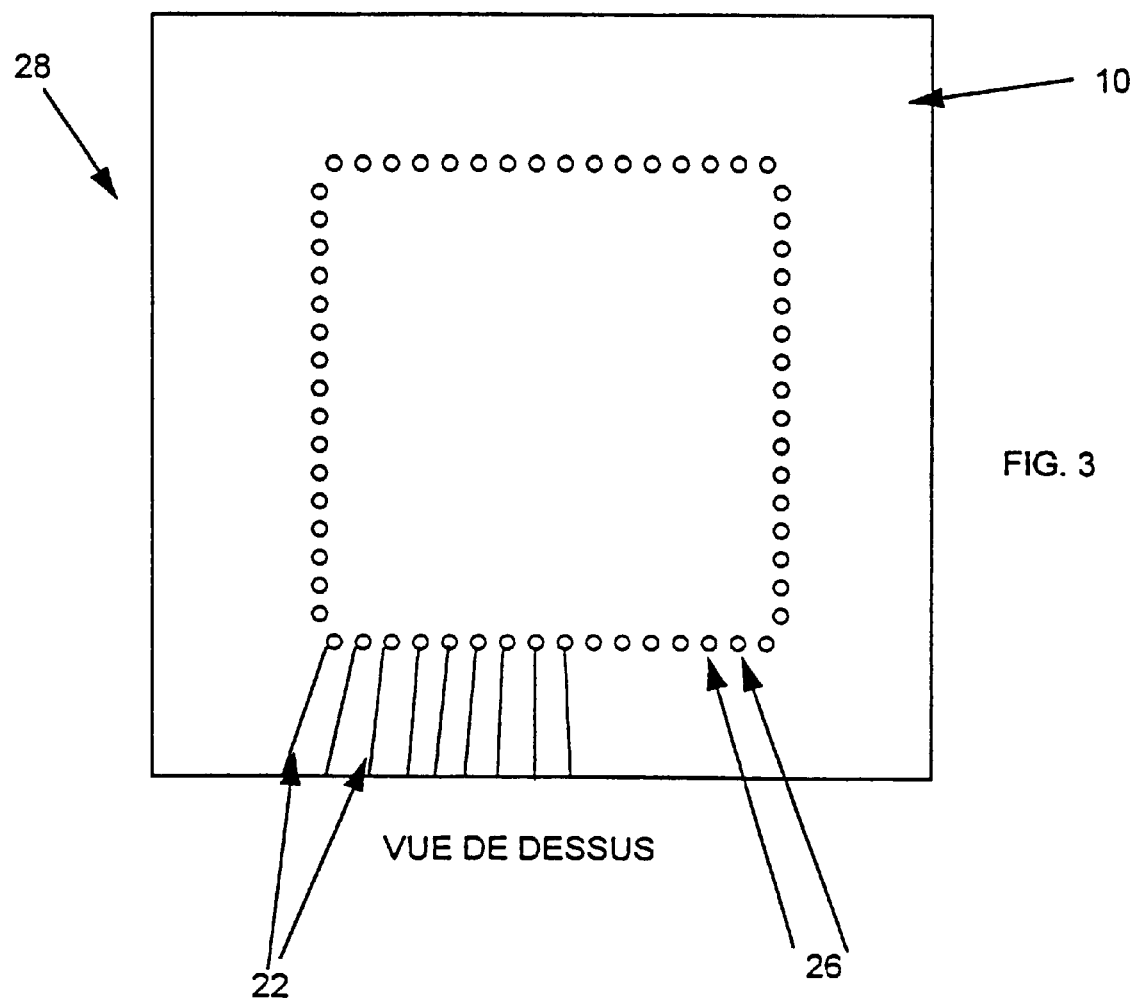
FIG. 3 is a plan view of FIG. 2.
Figures 4, 5, 6, 7:
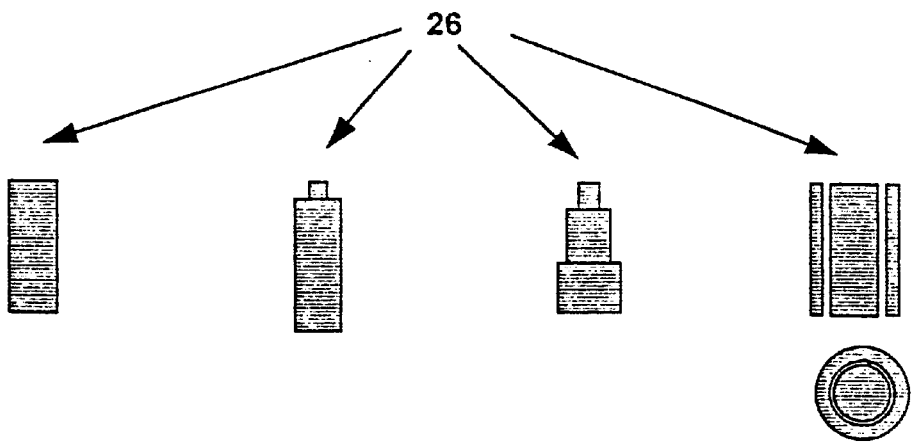
FIGS. 4 to 7 show different shapes of tips according to the application of the card.

In FIGS. 2 and 3, the multiple-tip card 28 comprises a high density of tips 26 due to the photolithography technology, the pitch between the different electro-deposited tips 26 being able to be a few tens of microns.

With reference to FIGS. 4 to 7, the tips 26 can have different cylindrical shapes with any base, notably a straight cylinder of constant cross section (FIG. 4), two superposed cylinders (FIG. 5) which may possibly have different materials, a superposition of cylinders of heightwise decreasing diameters (FIG. 6), and a coaxial shape (FIG. 7) for frequency testing. Other cross sections (square, polygonal) are also possible.

Figures 8, 9, 10:
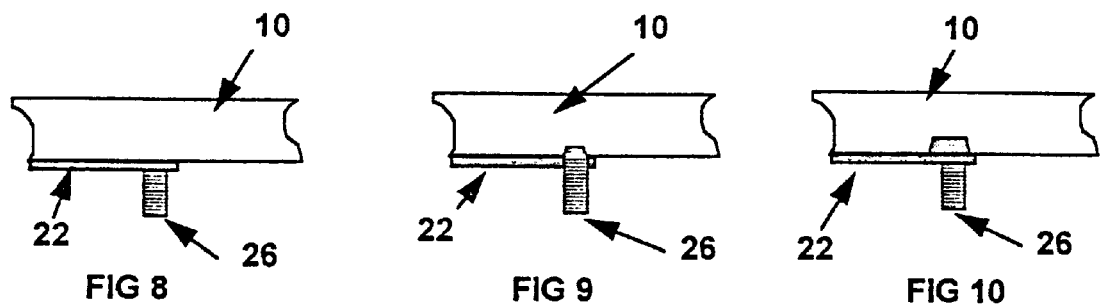
FIGS. 8 to 10 represent different means for electrical and mechanical connection of the tips on the substrate.

The various means for electrical and mechanical connection of the tips 26 to the substrate 10 are illustrated in FIGS. 8 to 10.

In FIG. 8, the tip 26 is deposited directly on the thin layer of the conductor 22, extending in a direction perpendicular to the substrate 10.

In FIG. 9, the base of the tip 26 is secured in the substrate 10 by passing through the conductor 22.

In FIG. 10, a damping material 30 is arranged in the substrate 10 and under the conductor 22. The base of the tip 26 is fixed on the opposite external surface of the conductor 22 as in FIG. 8.

Figure 1:
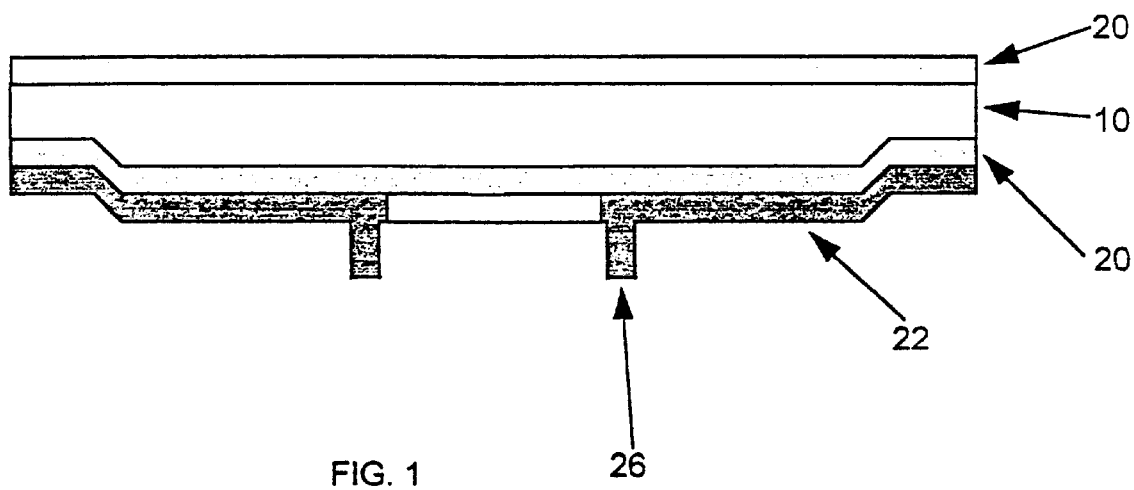
FIG. 1 shows a card obtained according to the process of the invention.
Figure 11:
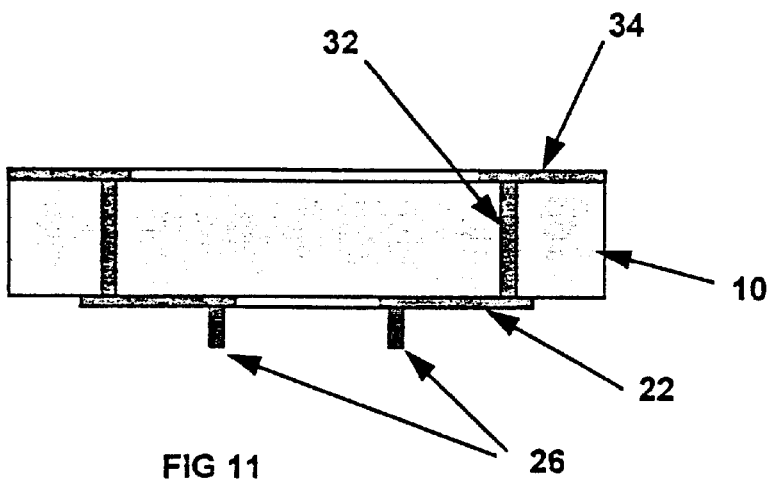
FIG. 11 shows an alternative version of FIG. 1, with a substrate with vias to bring the electrical connection across to the surface opposite the tips.

Instead of depositing conducting strips in thin layers on an etched substrate (as in the case of FIG. 1), it is also possible according to FIG. 11 to provide vias 32 passing through the substrate 10 to bring the electrical connection across to the surface 34 opposite the tips 26.

What is claimed is:

1. A process for manufacturing a card with multiple tips for testing one or more semiconductor chips of integrated circuits before encapsulation thereof, and comprising a substrate (10), one of the surfaces being provided with conducting strips connected to contacts in the form of tips (26), the process comprising:

anisotropically etching a surface of the substrate (10), the etching being nonemergent to form an electrical contact connection point;

forming an insulating layer on the surface of the monolithic substrate (10);

depositing a thin metal layer (22) by vapour deposition in a vacuum or by cathode sputtering directly on the insulating layer formed on the surface of the monolithic substrate (10);

forming the conducting strips by UV photolithography operation using a photosensitive resin, followed by etching of the thin metal layer (22) according to the location and shape of the tips (26);

performing another UV photolithography operation comprising depositing a thick layer (24) of photosensitive resin on the etched thin metal layer, the resin being revealed with a drawing (25) of the tips;

then manufacturing the tips (26) by electroforming using a metal ion bath to obtain electroformed pads corresponding to the shape of the drawing (25); and dissolving a remaining portion of the thick layer (24) of photosensitive resin in a solvent bath to obtain the tips (26) on the monolithic substrate (10).

2. The process for manufacturing a card with multiple tips according to claim 1, wherein the substrate (10) is formed by a material with a base selected from the group consisting of silicon, Gallium Arsenide, glass and quartz.

3. The process for manufacturing a card with multiple tips according to claim 1 wherein anisotropic etching of the substrate (10) takes place after an initial UV photolithography operation comprising producing through a mask (14) a local insulation of a layer of photosensitive resin (12) previously deposited on one of the surfaces of the substrate (10), and that anisotropic etching is achieved by immersion of the silicon substrate (10) in potassium hydroxide KOH.

4. The process for manufacturing a card with multiple tips according to claim 1, wherein the thin metal layer (22) is formed by a nickel-based material, a gold-based material or an aluminum-based material.

5. The process for manufacturing a card with multiple tips according to claim 4, wherein electroforming of the tips (26) is performed in a nickel sulfamate bath with a current density of about $1A/dm^2$.

6. A multiple-tip card for testing semiconductor chips, and comprising a substrate (10) processed according to the process claim 1 to obtain a high density of tips (26), the pitch between the different tips being a maximum of 100 microns.

7. The multiple-tip card according to claim 6, characterized in that the pads of the tips (26) have circular or polygonal cross sections.

8. The multiple-tip card according to claim 6, characterized in that each tip (26) is deposited on the thin conducting layer (22), with or without securing in the substrate (10).

9. The multiple-tip card according to claim 6, wherein the substrate (10) comprises a damping material (30) arranged under the thin conducting layer (22) opposite the corresponding tip (26).

10. The process for manufacturing a card with multiple tips according to claim 2, wherein anisotropic etching of the substrate (10) takes place after a first UV photolithography operation comprising producing through a mask (14) a local insulation of a layer of photosensitive resin (12) previously deposited on one of the surfaces of the substrate (10), and that anisotropic etching is achieved by immersion of the silicon substrate (10) in potassium hydroxide KOH.

11. A multiple-tip card for testing semiconductor chips, and comprising a substrate (10) processed according to the process of claim 2 to obtain a high density of tips (26), the pitch between the different tips being a maximum of 100 microns.

12. A multiple-tip card for testing semiconductor chips, and comprising a substrate (10) processed according to the process of claim 3 to obtain a high density of tips (26), the pitch between the different tips being a maximum of 100 microns.

13. A multiple-tip card for testing semiconductor chips, and comprising a substrate (10) processed according to the process of claim 4 to obtain a high density of tips (26), the pitch between the different tips being a maximum of 100 microns.

14. A multiple-tip card for testing semiconductor chips, and comprising a substrate (10) processed according to the process of claim 5 to obtain a high density of tips (26), the pitch between the different tips being a maximum of 100 microns.

15. The multiple-tip card according to claim 7, wherein each tip (26) is deposited on the thin conducting layer (22), with or without securing in the substrate (10).

16. The multiple-tip card according to claim 7, wherein the substrate (10) comprising a damping material (30) arranged under the thin conducting layer (22) opposite the corresponding tip (26).

* * * * *